(12) United States Patent
Voronin et al.

(10) Patent No.: US 10,063,062 B2
(45) Date of Patent: Aug. 28, 2018

(54) METHOD OF DETECTING PLASMA DISCHARGE IN A PLASMA PROCESSING SYSTEM

(71) Applicant: Tokyo Electron Limited, Minato-ku, Tokyo (JP)

(72) Inventors: Sergey Voronin, Delmar, NY (US); Alok Ranjan, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 163 days.

(21) Appl. No.: 14/944,904

(22) Filed: Nov. 18, 2015

(65) Prior Publication Data

US 2016/0372933 A1  Dec. 22, 2016

Related U.S. Application Data

(60) Provisional application No. 62/181,537, filed on Jun. 18, 2015.

(51) Int. Cl.
*H02J 4/00* (2006.01)
*G01R 27/02* (2006.01)
*H01J 37/32* (2006.01)

(52) U.S. Cl.
CPC ............. *H02J 4/00* (2013.01); *G01R 27/02* (2013.01); *H01J 37/32146* (2013.01); *H01J 37/32174* (2013.01); *H01J 37/32183* (2013.01); *H01J 37/32935* (2013.01)

(58) Field of Classification Search
CPC ................................. H01J 37/32009
See application file for complete search history.

(56) References Cited

U.S. PATENT DOCUMENTS

| | | | |
|---|---|---|---|
| 6,599,759 B2 | 7/2003 | Yang et al. | |
| 7,314,537 B2 | 1/2008 | Baldwin et al. | |
| 9,111,746 B2 * | 8/2015 | Ranjan | H01L 21/0206 |
| 9,114,666 B2 * | 8/2015 | Valcore, Jr. | H01J 37/32091 |
| 9,368,329 B2 * | 6/2016 | Valcore, Jr. | H01J 37/32146 |

* cited by examiner

*Primary Examiner* — Hai L Nguyen
(74) *Attorney, Agent, or Firm* — Oblon, McClelland, Maier & Neustadt, L.L.P.

(57) ABSTRACT

Detecting presence or absence of plasma is accomplished from probe signals. In one embodiment, a low-power modulated signal is applied to an electrostatic chuck from a bias power generator. A corresponding system then monitors peak-to-peak voltage (Vpp) signal responses or radio frequency current responses. The probe signal can be generated to have insufficient power to either ignite or sustain plasma discharge (or cause component damage). Thus, low-duty and/or low current pulsing signals to be used. Presence or absence of the bulk plasma will then result in different Vpp or radio frequency current values.

10 Claims, 3 Drawing Sheets

METHOD OF DETECTING PLASMA DISCHARGE IN A PLASMA PROCESSING SYSTEM

CROSS REFERENCE TO RELATED APPLICATIONS

The present application claims the benefit of U.S. Provisional Patent Application No. 62/181,537, filed on Jun. 18, 2015, entitled "Method of Detecting Plasma Discharge in a Plasma Processing System," which is incorporated herein by reference in its entirety.

BACKGROUND OF THE INVENTION

This disclosure relates to plasma processing systems.

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to a particular process being performed within the chamber (e.g., etching processes in which materials are removed from the substrate or deposition processes in which materials are added to the substrate).

SUMMARY

The formation of a population of charged species (ions, etc.) and chemically reactive species necessary for performing the function of the plasma processing system (i.e. material etch, material deposition, etc.) at the substrate surface, or for cleaning the plasma processing chamber of residues is not always perfectly maintained. The plasma itself can become extinguished during a given substrate processing or chamber cleaning operation. Detecting whether a plasma is being maintained or whether a plasma has been extinguished is beneficial to prevent damage to substrates and chamber components.

Conventionally, photodiode light sensors are widely used for plasma detection. In general, photodiode light sensors are robust, simple and inexpensive in manufacturing. Such sensors, however, can incorrectly detect existence of plasma. These sensors have a simple light detection function ("light on" or "light off") and thus cannot distinguish between different types of light and plasma discharges. Being able to distinguish different plasma discharges can be very beneficial for some plasma reactors. For example, if a particular plasma is extinguished while plasma creation/maintenance power is still being coupled to a corresponding plasma chamber, then components of a plasma processing system can be damaged. Moreover, a given light sensor can still be able to detect light from a parasitic (abnormal) discharge in gas media, which prevents triggering alarms and/or keeps chamber operation continuous or otherwise keeps power coupled to the chamber, which can damage chamber components.

Techniques herein include applying a modulated low power signal ("probe signal") to an electrostatic chuck (ESC) from a bias power generator. A peak-to-peak voltage (Vpp) signal response or radio frequency (RF) current response is then monitored. The presence or absence of bulk plasma will result in different Vpp or RF current values, which indicate whether a plasma is detected.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include applying a modulated low-power signal ("probe signal") to an electrostatic chuck (ESC) from a bias power generator. A peak-to-peak (Vpp) voltage signal response or radio frequency (RF) current response is then monitored. The presence or absence of bulk plasma will result in different Vpp or RF current values, which indicate whether a plasma is detected.

Conventionally, various techniques have been implemented for exciting a gas into plasma for the treatment of a substrate during semiconductor device fabrication, as described above. In particular, ("parallel plate") capacitively coupled plasma (CCP) processing systems, or inductively coupled plasma (ICP) processing systems have been used for plasma excitation. Among other types of plasma sources, there are microwave plasma sources (including those utilizing electron-cyclotron resonance (ECR)), surface wave plasma (SWP) sources, and helicon plasma sources.

Some plasma reactors are known as surface wave plasma systems and have an antenna with an array of slots and use a microwave power source. In this surface wave plasma system, the plasma is generated near the antenna in a narrow layer limited by a skin depth (which is typically around 1 cm) and diffuses in the chamber toward the substrate. An electromagnetic field from the antenna is decaying rapidly within this layer. If the plasma is not ignited properly, or the main discharge extinguishes, then the microwave field can interact with chamber parts resulting in their local heating and "abnormal" surface discharge. The latter result can generate intensive light emission in a wide wavelength band which can be detected by a photodiode and mistakenly identified as plasma discharge at typical operating conditions. The optical plasma sensor will detect "plasma presence" in the chamber and will not trigger a microwave generator interlock, resulting in further heating and damaging of the chamber parts by the "unshielded" microwave.

Figure 1:
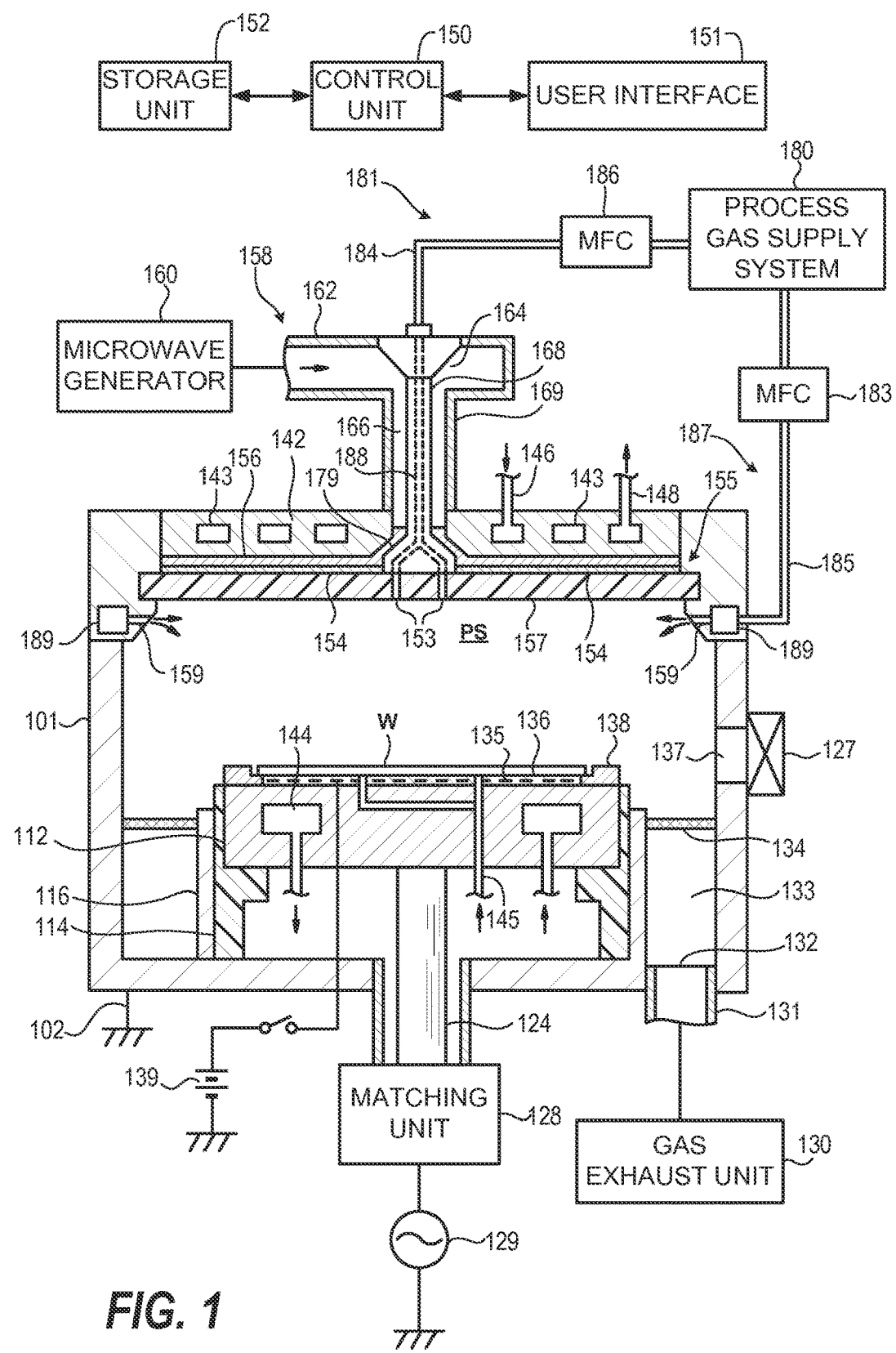
FIG. 1 is a cross-sectional view of an example microwave plasma processing system in accordance with embodiments herein.

FIG. 1 is a schematic cross-sectional view of a microwave plasma processing apparatus in accordance with embodiments herein. The microwave plasma processing apparatus can be configured to perform plasma processing such as, for example, plasma etching, plasma chemical vapor deposition (CVD), plasma atomic layer deposition (ALD), etc., under surface wave plasma excited using microwaves and a flat, plate-type slot antenna. Plasma processing can be executed within processing chamber 101, which can be a cylindrical vacuum chamber made of a metal such as aluminum or stainless steel. The processing chamber 101 is grounded such as by ground wire 102. The processing chamber 101 defines a processing vessel providing a process space PS for plasma generation. An inner wall of the processing vessel can be coated with alumina, yttria, or other protectant.

At a lower, central area within the processing chamber 101, a susceptor 112 (which can be disc-shaped) can serve as a mounting table on which, for example, a substrate W to be processed (such as a semiconductor wafer) can be mounted. Substrate W can be moved into the processing chamber 101 through loading/unloading port 137 and gate valve 127. An electrostatic chuck 136 is provided on a top surface of the susceptor 112. Electrode 135 is electrically connected to DC power source 139 (direct current power source). The electrostatic chuck 136 attracts the substrate W thereto via an electrostatic force generated when DC voltage from the DC power source 139 is applied to the electrode 135 so that substrate W is securely mounted on the susceptor 112. A high-frequency power source 129 for RF bias is electrically connected to the susceptor 112 or bias electrode through a matching unit 128 (to match impedance) and a power feeding rod 124. The high-frequency power source 129 outputs high frequency waves of a frequency suitable for controlling the energy of ions drawn into the substrate W. For example, high frequency waves of 13.56 MHz or other power can be used for attracting ions. A focus ring 138 is provided radially outside the electrostatic chuck 136 to annularly surround the substrate W.

A coolant flow path 144 can extend, for example, in a circumferential direction, within susceptor 112 and can be configured to receive circulated coolant to help control a processing temperature of substrate W on the electrostatic chuck 136. Additionally, heat transfer gas from a heat transfer gas supply unit (not illustrated) can be supplied to a space between a top surface of the electrostatic chuck 136 and a rear surface of the substrate W through a gas supply line 145.

An exhaust path 133 can be formed along an outer periphery of support unit 114 and/or conductive support unit 116 and an inner wall of the processing chamber 101 in which an annular baffle plate 134 is attached to the top or inlet of the exhaust path 133 and an exhaust port 132 (or multiple exhaust ports), which is provided in a bottom portion of the exhaust path 133. A gas exhaust unit 130 is connected to each exhaust port 132 through gas exhaust line 131, which can have multiple exhaust lines. The gas exhaust unit 130 can include a vacuum pump such as a turbo molecular pump configured to decompress the plasma processing space within the processing chamber 101 to a desired vacuum condition.

An upper portion of the microwave plasma processing apparatus will now be described. A dielectric window 157 can be configured to introduce microwaves and function as a ceiling plate. A space just below the dielectric window 157 within the processing chamber 101 serves as a plasma generation space as process space PS. The dielectric window 157 can be made of a microwave-permeable dielectric material such as, for example, quartz or ceramics such as aluminum oxide, and can have a thickness of, for example, about 20 mm or sufficient for pressure resistance. The dielectric window 157 can be provided with a slot plate 154 which can be a conductor attached to, or disposed on, a top surface of the dielectric window 157. The slot plate 154 can have a plurality of slot pairs that are configured to irradiate microwaves distributed concentrically in a rotationally symmetric arrangement, though other geometric configurations can be used. On the slot plate 154, a dielectric plate 156 can shorten the wavelength of microwaves propagated inside the slot plate 154. The slot plate 154 is electromagnetically coupled to a microwave transmission line 158. A slot antenna 155, which can be a flat plate-type slot antenna, for example, or a disc-shaped, radial line slot antenna, can include the slot plate 154, the dielectric plate 156, and an antenna rear plate (not shown) provided to be opposite to the slot plate 154.

The microwave transmission line 158 is a line configured to transmit, for example, microwaves of 2.45 GHz (or other frequency), which are output from a microwave generator 160 with a predetermined power, to the slot antenna 155, and can include a waveguide 162, a waveguide-coaxial line converter 164, and a coaxial tube 166. The waveguide 162 can be, for example, a rectangular waveguide configured to transmit microwaves from the microwave generator 160 to the waveguide-coaxial line converter 164. The coaxial tube 166 extends vertically downward from the waveguide-coaxial line converter 164 to the central portion of the top of the processing chamber 101 and a terminal end of the coaxial tube 166 is coupled to the slot antenna 155 through the dielectric plate 156. An outer conductor 169 and an inner conductor 168 can define a space for wave transmission. A connector unit 179 is connected to the lower end of the inner conductor 168.

In addition, the microwaves expanded in a radial direction while being shortened in wavelength within the dielectric plate 156 become plane waves of circular polarization having two orthogonal polarization components from each slot pair of the slot antenna 155 and are radiated toward the inside of the processing chamber 101. Process gas in the vicinity of the surface of the dielectric window 157 is then ionized by the electric fields of surface waves (microwave electric fields) propagated in the radial direction along the surface of the dielectric window 157 and, as a result, high-density and low-electronic temperature plasma is generated.

The dielectric plate 156 can include a cooling jacket plate 142, which can serve as an antenna rear plate to cover a top of the processing chamber 101. The cooling jacket plate 142 can be configured to absorb heat (radiating) of dielectric loss which is generated from the dielectric window 157 and the dielectric plate 156. To provide cooling, a coolant can be circulated in a flow path 143, and fed and removed through conduit 146 and conduit 148.

The microwave plasma processing apparatus can include two routes for process gas introduction. Upper gas introduction section 181 includes a gas flow path provided in the dielectric window 157, and a side gas introduction section 187 that includes a gas flow path provided in a side wall of the processing chamber 101, as a gas introduction mechanism configured to introduce a processing gas into the processing chamber 101.

In the upper gas introduction section 181, a gas flow path 188 is provided in the inner conductor 168 of the coaxial tube 166 to extend in an axial direction through the inside of the inner conductor 168. Additionally, a first gas supply line 184 from a process gas supply system 180 is connected to the upper end of the inner conductor 168 and the gas flow path 188 of the first gas supply line 184. The connector unit 179 can have a plurality of internal flow paths which are bored and radially branched from a common inlet. The connector unit 179 can be made of a conductor, and can be electrically grounded. The dielectric window 157 can be formed with inner flow paths connected to the terminal ends of a branched gas supply paths such as for process gas to vertically pass through the dielectric window 157 to face the plasma generation space within the processing chamber 101.

In the upper gas introduction section 181, a processing gas, which is pumped from the process gas supply system 180 at a predetermined pressure (for example, an etching gas or a film-forming gas), flows through the first gas supply line 184, the gas flow path 188 of the coaxial tube 166, and is ejected from each gas jet port 153 at the terminal end. A mass flow controller (MFC) 186 and corresponding valve can be used for opening/closing and metering process gas flow in first gas supply line 184.

The side gas introduction section 187 is placed at a position lower than a bottom surface of the dielectric window 157, and can include a buffer chamber 189 (manifold), sidewall gas jet ports 159, and a second gas supply line 185 extending from the process gas supply system 180 to the buffer chamber 189. A mass flow controller 183 and corresponding valve can be used for opening/closing and metering process gas flow in second gas supply line 185. Process gas from side gas introduction section 187 can be jetted in a substantially horizontal flow from the respective sidewall gas jet ports 159 to be diffused in the process space PS.

Components of the plasma processing apparatus can be connected to, and controlled by, a control unit 150, which in turn can be connected to a corresponding storage unit 152 and user interface 151. Control unit 150 can include a microcomputer configured to control operation of each of the components within the microwave plasma processing apparatus such as, for example, the gas exhaust unit 130, the high-frequency power source 129, DC power source 139 for the electrostatic chuck 136, microwave generator 160, the upper gas introduction section 181, the side gas introduction section 187, the process gas supply system 180, and a heat transfer gas supply unit (not illustrated) or the operations of the entire apparatus. Various plasma processing operations can be executed via the user interface 151, and various plasma processing recipes and operations can be stored in the storage unit 152. A given substrate, thus, can be processed within the plasma processing chamber with various microfabrication techniques.

Accordingly, using this microwave plasma processing apparatus, or another plasma processing apparatus, plasma detection can be accomplished herein.

Techniques herein include detecting presence of plasma from probe signals. In one embodiment, a low-power modulated signal (a probe signal) is applied to the electrostatic chuck (ESC) from a bias power generator. A corresponding system then monitors peak-to-peak (Vpp) voltage signal responses or RF current responses. The probe signal can be generated to have insufficient power to either ignite or sustain plasma discharge (or cause component damage). Thus, low-duty and/or low current pulsing signals to be used. Presence or absence of the bulk plasma will then result in different Vpp or RF current values.

Figure 8:
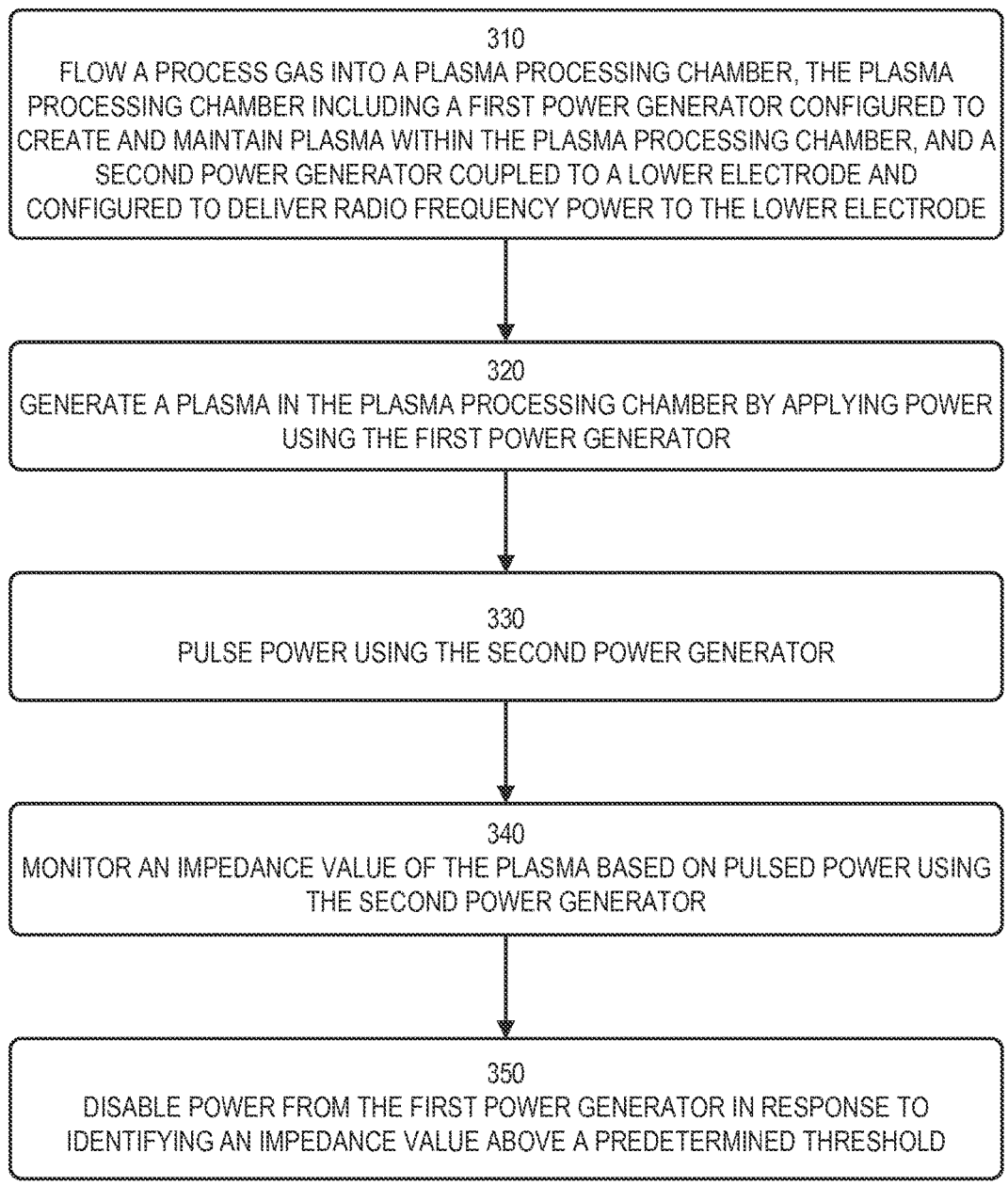
FIG. 8 is a flow chart of a method for detecting plasma according to embodiments disclosed herein.

FIG. 8 shows a flow chart for plasma detection as disclosed herein. In step 310, a process gas is flow into a plasma processing chamber. For example, using upper gas introduction section 181 or side gas introduction section 182, one or more process gases are flowed into the plasma processing chamber, such as processing chamber 101. The plasma processing chamber includes a first power generator configured to create and maintain plasma within the plasma processing chamber, and a second power generator coupled to a lower electrode and configured to deliver radio frequency power to the lower electrode. For example, this first power generator can include microwave generator 160, and the second power generator can include high-frequency power source 129.

In step 320, a plasma is generated in the plasma processing chamber by applying power using the first power generator. In other words, sufficient power is coupled to the plasma generation space to generate ionizing collisions with the supplied process gas, thereby forming plasma. An amount of power coupled to the plasma generation space depends on type power coupling technology being used (inductively coupled, capacitively-coupled, surface wave plasma, etc.).

Figure 2:
FIG. 2 is a diagram illustrating modulated bias power according to embodiments disclosed herein.

In step 330, power is pulsed using the second power generator. For example, using lower electrode or substrate holder biasing apparatus, power is pulsed into the plasma processing chamber. FIG. 2 illustrates modulated bias (probe) power. As can be seen, in one embodiment, discrete signals are generated. In one embodiment, the power applied can be on the order of tens of watts, with a relatively low frequency and relatively low duty cycle.

In one example, techniques can include monitoring an impedance value of the plasma based on pulsed power using the second power generator; and in response to identifying an impedance value above a predetermined threshold, disable power from the first power generator. In step 340, an impedance value of the plasma is monitored based on pulsed power using the second power generator. Control unit 150 or equivalent control apparatus and sensors can be used for such monitoring.

Figure 3:
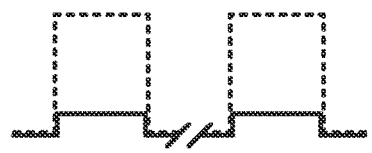
FIG. 3 is a diagram illustrating plasma impedance in different states according to embodiments disclosed herein.
Figure 4:
FIG. 4 is a diagram illustrating a high peak-to-peak voltage (Vpp) signal according to embodiments disclosed herein.
Figure 5:
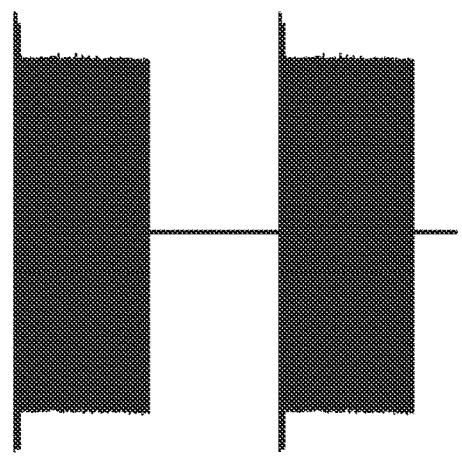
FIG. 5 is a diagram illustrating a low peak-to-peak voltage (Vpp) signal according to embodiments disclosed herein.

In step 350, power is disabled from the first power generator in response to identifying an impedance value above a predetermined threshold. FIG. 3 illustrates low and high impedance of peak-to-peak voltage (Vpp) in a given plasma processing chamber. When a given plasma exists or is "on," then there will be a relatively low impedance because signals can pass through the plasma. This low Vpp is illustrated with the solid pulsed line. If a plasma is "off" such as by becoming extinguished, then a relatively high Vpp will result, as shown with the dotted line. FIG. 4 illustrates a Vpp signal response from an existing plasma. Note that the impedance value (vertical value) is relatively low. In FIG. 5, however, a relatively high Vpp value (signal response) is illustrated, which is indicative of a plasma being off or extinguished. Thus, in response to identifying this impedance state, a system controller can quickly shut of plasma generating power being coupled to the chamber to prevent damaging interior components from overheating, etc., especially from microwave heating.

Figure 6:
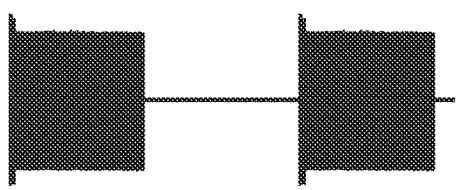
FIG. 6 is a diagram illustrating radio frequency (RF) current signal response without plasma according to embodiments disclosed herein.
Figure 7:
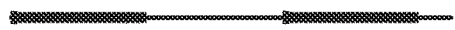
FIG. 7 is a diagram illustrating radio frequency (RF) current signal response with plasma according to embodiments disclosed herein.

In another embodiment, instead of monitoring impedance, a radio frequency current signal through the plasma can be monitored, with this signal being pulsed using the second power generator. FIGS. 6 and 7 illustrate radio frequency signal strength through a plasma. In FIG. 6, a relatively strong signal is shown, indicating that plasma exists in the plasma processing chamber. FIG. 7 illustrates relatively weak signal strength, indicating absence of plasma in the plasma processing chamber. With such a weak RF signal detected, plasma generating power can be decoupled or shut off.

In other embodiments, pulsing power using the second power generator includes pulsing at a power value less than a threshold power value that ignites plasma from the process gas. In other words, power used for pulsing signals can be less than sufficient to ignite a plasma, and even one or multiple orders of magnitude less than a plasma striking power. As such, this plasma detection signal can be insufficient to damage chamber parts regardless of the existence of a plasma. In some embodiments, applying biasing power to the lower electrode using the second power generator can be executed while simultaneously pulsing power using the lower electrode. In other words, this plasma detection technique can be used during directional (anisotropic) etch operations. Moreover, generating the plasma can occur when no substrate is position in the plasma processing chamber. For example, techniques herein are beneficial during plasma chamber cleaning operations.

In some embodiments, power can be pulsed 5 to 100 times per second, with each pulse having a duration of approximately 1 to 100 microseconds. Note that longer pulse durations can be used, though it is beneficial to quickly detect absence of plasma so as to prevent initiation of chamber damage.

In other embodiments, monitoring the impedance value of the plasma can include monitoring the impedance value between the lower electrode and chamber walls of the plasma processing chamber. Alternatively, monitoring the impedance value of the plasma can include monitoring the impedance value between the lower electrode and an upper electrode of the plasma processing chamber.

Accordingly, techniques herein can be used to accurately and quickly determine presence and absence of plasma, such as to prevent chamber damage from power generators. Techniques herein provide advantage over conventional techniques. For example, microwave heating in a chamber—without plasma—can generate light as chamber surfaces become damaged. This light emission can provide a false positive plasma detection to photo diode sensors. Techniques herein are not based on light detection and thus can reliable identify presence or absence of plasma. Moreover, this technique is beneficial because monitoring Vpp signals is not a process sensitive to chamber contamination.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:
1. A method for detecting plasma, the method comprising:
flowing a process gas into a plasma processing chamber, the plasma processing chamber including a first power generator configured to create and maintain plasma within the plasma processing chamber, and a second power generator coupled to a lower electrode and configured to deliver radio frequency power to the lower electrode;
generating a plasma in the plasma processing chamber by applying power using the first power generator;
pulsing power using the second power generator;
monitoring an impedance value of the plasma based on pulsed power using the second power generator; and
applying biasing power to the lower electrode using the second power generator while simultaneously pulsing power using the lower electrode; and
in response to identifying said impedance value above a predetermined threshold, disabling power from the first power generator.

2. The method of claim 1, wherein pulsing power using the second power generator includes pulsing at a power value less than a threshold power value that ignites plasma from the process gas.

3. The method of claim 1, wherein generating the plasma occurs when no substrate is positioned in the plasma processing chamber.

4. The method of claim 1, wherein power is pulsed 5 to 100 times per second, with each pulse having a duration of approximately 1 to 100 microseconds.

5. The method of claim 1, wherein monitoring the impedance value of the plasma includes monitoring the impedance value between the lower electrode and chamber walls of the plasma processing chamber.

6. The method of claim 1, wherein monitoring the impedance value of the plasma includes monitoring the impedance value between the lower electrode and an upper electrode of the plasma processing chamber.

7. The method of claim 1, wherein the first power generator uses a surface wave plasma power generator system.

8. The method of claim 1, wherein the first power generator uses an inductively coupled or capacitively-coupled power generator system.

9. A method for detecting plasma, the method comprising:
   flowing a process gas into a plasma processing chamber, the plasma processing chamber including a first power generator configured to create and maintain plasma within the plasma processing chamber, and a second power generator coupled to a lower electrode and configured to deliver radio frequency power to the lower electrode;
   generating a plasma in the plasma processing chamber by applying power using the first power generator;
   pulsing power using the second power generator;
   monitoring an impedance value of the plasma based on pulsed power using the second power generator; and
   in response to identifying said impedance value above a predetermined threshold, disabling power from the first power generator, wherein said monitoring the impedance value of the plasma includes monitoring the impedance value between the lower electrode and chamber walls of the plasma processing chamber.

10. A method for detecting plasma, the method comprising:
   flowing a process gas into a plasma processing chamber, the plasma processing chamber including a first power generator configured to create and maintain plasma within the plasma processing chamber, and a second power generator coupled to a lower electrode and configured to deliver radio frequency power to the lower electrode;
   generating a plasma in the plasma processing chamber by applying power using the first power generator;
   pulsing power using the second power generator;
   monitoring an impedance value of the plasma based on pulsed power using the second power generator; and
   in response to identifying said impedance value above a predetermined threshold, disabling power from the first power generator, wherein said monitoring the impedance value of the plasma includes monitoring the impedance value between the lower electrode and an upper electrode of the plasma processing chamber.

\* \* \* \* \*